(12) United States Patent
Cheng et al.

(10) Patent No.: US 11,545,624 B2
(45) Date of Patent: Jan. 3, 2023

(54) PHASE CHANGE MEMORY CELL RESISTIVE LINER

(71) Applicant: International Business Machines Corporation, Armonk, NY (US)

(72) Inventors: Kangguo Cheng, Schenectady, NY (US); Zuoguang Liu, Schenectady, NY (US); Juntao Li, Cohoes, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 17/215,278

(22) Filed: Mar. 29, 2021

(65) Prior Publication Data

US 2022/0310913 A1 Sep. 29, 2022

(51) Int. Cl.
*H01L 45/00* (2006.01)

(52) U.S. Cl.
CPC ............ *H01L 45/126* (2013.01); *H01L 45/06* (2013.01); *H01L 45/1233* (2013.01); *H01L 45/16* (2013.01)

(58) Field of Classification Search
CPC ....... H01L 45/00; H01L 45/126; H01L 45/06; H01L 45/1233; H01L 45/16
See application file for complete search history.

(56) References Cited

U.S. PATENT DOCUMENTS

| | | | |
|---|---|---|---|
| 7,417,245 B2 | 8/2008 | Happ et al. | |
| 9,472,274 B1 | 10/2016 | Lung | |
| 10,050,194 B1 | 8/2018 | Nardi et al. | |
| 10,056,546 B2 | 8/2018 | BrightSky et al. | |
| 10,141,503 B1 | 11/2018 | BrightSky et al. | |
| 10,763,307 B1 | 9/2020 | Carta | |
| 10,833,267 B2 | 11/2020 | Ok et al. | |
| 2010/0078621 A1 | 4/2010 | Breitwisch et al. | |
| 2015/0243884 A1 | 8/2015 | BrightSky et al. | |
| 2018/0205017 A1 | 7/2018 | Bruce et al. | |
| 2021/0013504 A1 | 1/2021 | Mitlin | |
| 2021/0257547 A1 | 8/2021 | Shen | |

FOREIGN PATENT DOCUMENTS

KR 1020170022423 A 3/2017

OTHER PUBLICATIONS

Kim et al., "A Phase Change Memory Cell with Metallic Surfactant Layer as a Resistance Drift Stabilizer," International Electron Devices Meeting (IEDM), Dec. 9-11, 2013, 4 pages.
Kim et al., "ALD-based Confined PCM with a Metallic Liner toward Unlimited Endurance," International Electron Devices Meeting (IEDM), Dec. 3-7, 2016, 4 pages.
Bruce R L et al: Mushroom-type phase change memory with projection liner: an array-level demonstration of conductance drift and noise mitigation. Mar. 21, 2021 XP033905941.
International Search Report and Written Opinion for Application PCT/EP2022/058248, dated Sep. 27, 2022, 13 pages.

*Primary Examiner* — Marvin Payen
(74) *Attorney, Agent, or Firm* — Grant M. McNeilly

(57) ABSTRACT

A phase change memory (PCM) cell includes a first electrode, a heater electrically connected to the first electrode, a PCM material electrically connected to the heater, a second electrode electrically connected to the PCM material, and a resistive liner in direct contact with and electrically connected to a sidewall of the heater and to the PCM material.

25 Claims, 14 Drawing Sheets

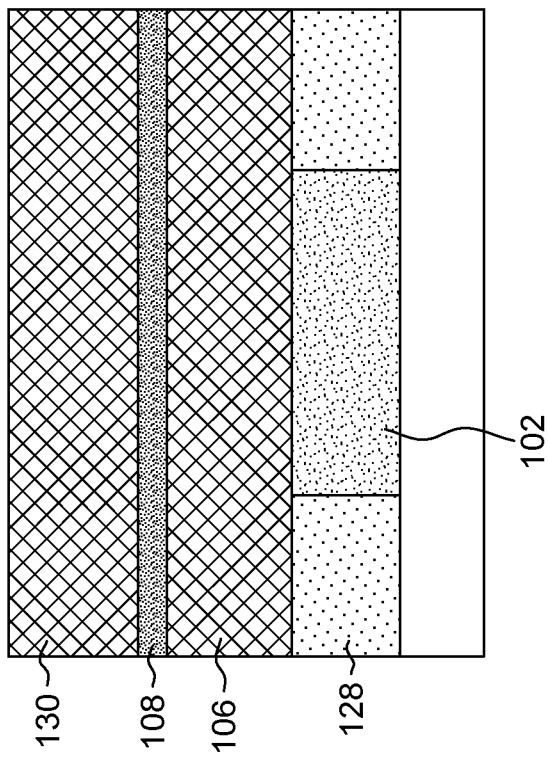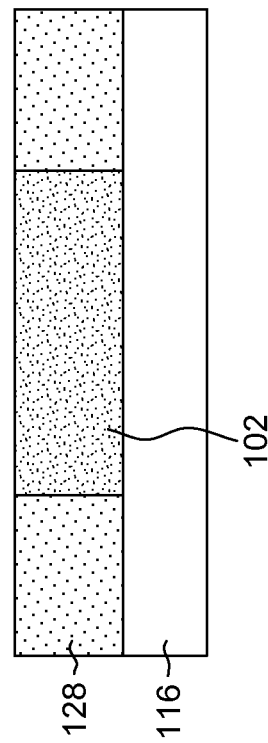

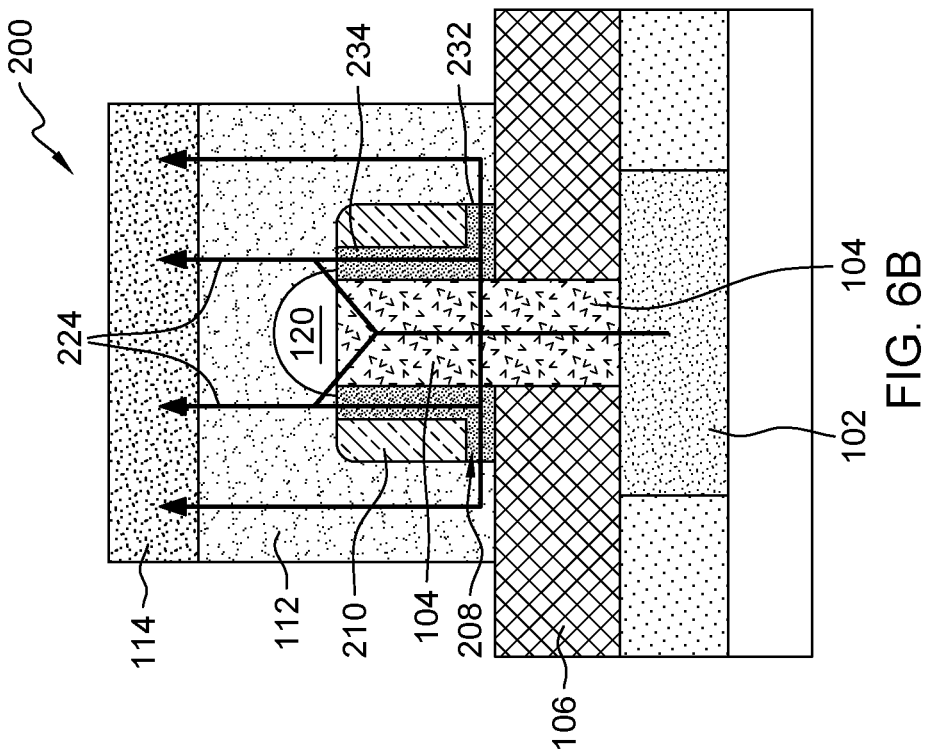
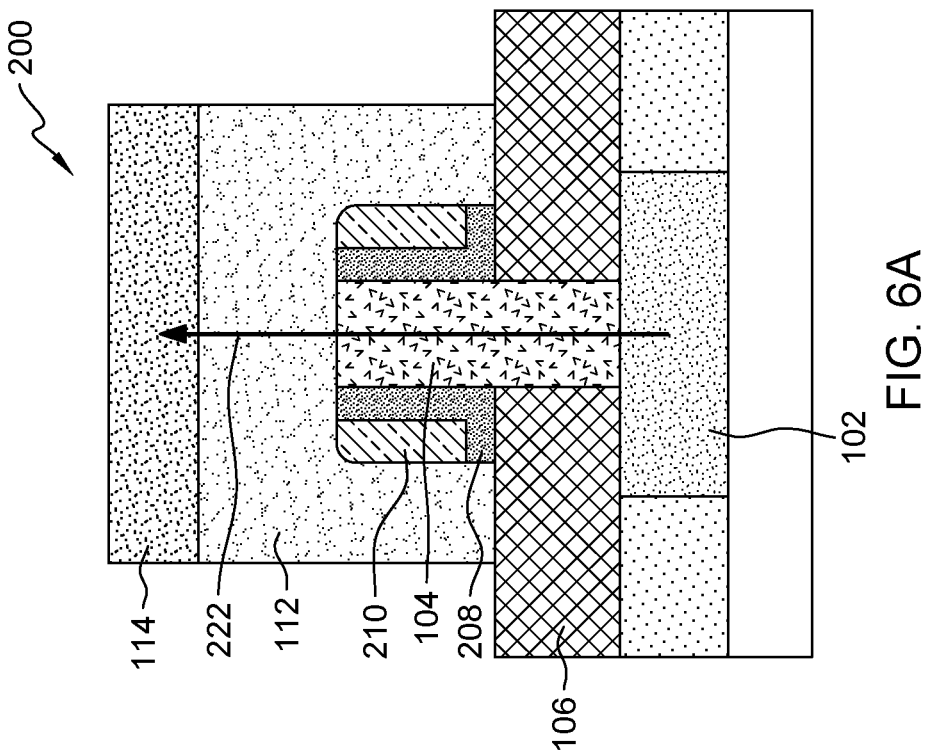

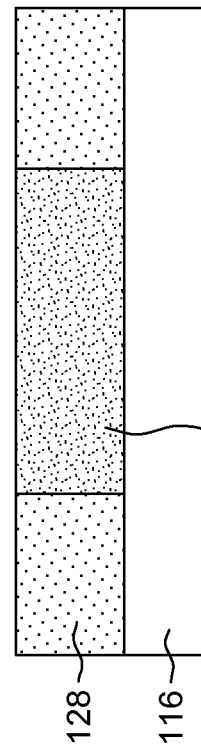
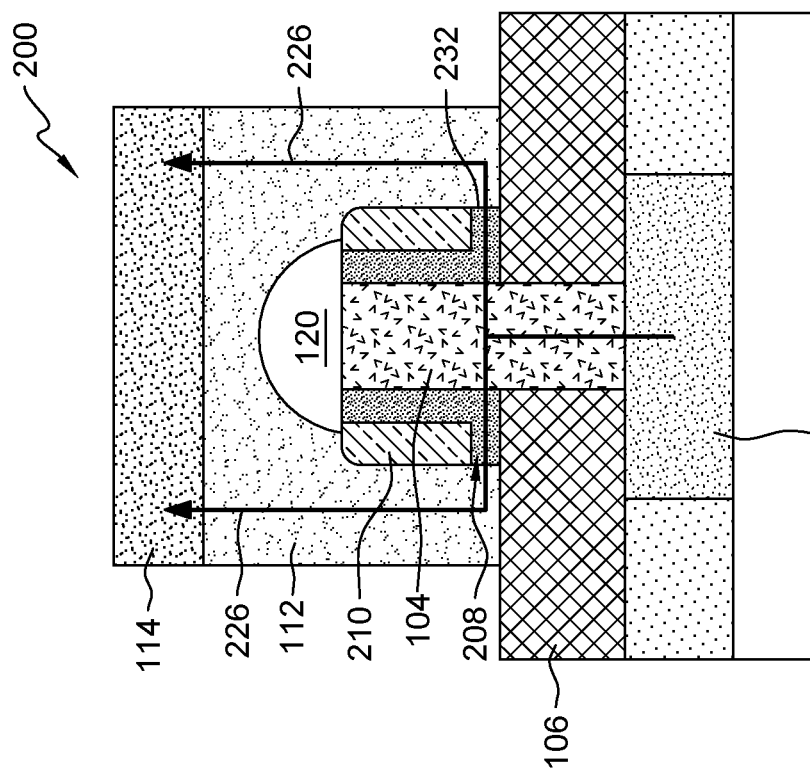

PHASE CHANGE MEMORY CELL RESISTIVE LINER

BACKGROUND

The present invention relates to computer memory, and more specifically, to phase change material memory devices with resistive liners.

Phase change memory (PCM) can be utilized for both training and inference in analog computing for artificial intelligence. The PCM structures can include phase change memristive devices with tunable conductivities and overall high device resistance with high retention to minimize energy consumption. This tuning can be the result of creating an amorphous phase in the PCM material. However, the resistance of the PCM material can change over time, which can negatively affect the integrity of the stored data.

SUMMARY

According to an embodiment of the present disclosure, a phase change memory (PCM) cell includes a first electrode, a heater electrically connected to the first electrode, a PCM material electrically connected to the heater, a second electrode electrically connected to the PCM material, and a resistive liner in direct contact with and electrically connected to a sidewall of the heater and to the PCM material.

According to an embodiment of the present disclosure, a method of manufacturing a PCM cell including forming a first electrode, forming a first electrical insulating layer on the first electrode, forming a resistive liner on the first electrical insulating layer, forming a heater that extends from the first electrode and through the first electrical insulating layer and the resistive liner, forming a PCM material on the heater and the resistive liner, and forming a second electrode on the PCM material.

According to an embodiment of the present disclosure, a PCM cell including a first electrode, a heater in direct contact with and electrically connected to the first electrode, a PCM material in direct contact with and electrically connected to the heater, a second electrode in direct contact with and electrically connected to the PCM material, and a first resistive liner in direct contact with and electrically connected to the heater and to the PCM material.

According to an embodiment of the present disclosure, a PCM cell includes a first electrode, a heater electrically connected to the first electrode, a PCM material electrically connected to the heater, a second electrode electrically connected to the PCM material, and a resistive liner in direct contact with and electrically connected to a sidewall of the heater, wherein the resistive liner has an L-shaped cross-section with a first leg extending along the sidewall of the heater and a second leg extending outward from the heater.

According to an embodiment of the present disclosure, a method of manufacturing a PCM cell includes forming a first electrode, forming a first electrical insulating layer on the first electrode, and forming a heater that extends from the first electrode and through the first electrical insulating layer. The method also includes forming a resistive liner on the first electrical insulating layer and on a portion of the heater such that a portion of the heater is not covered by the resistive liner, forming a PCM material on the heater and the resistive liner, and forming a second electrode on the PCM material.

BRIEF DESCRIPTION OF THE DRAWINGS

FIGS. 4A-4G are a series of cross-section views of a method of manufacturing the PCM cell, in accordance with an embodiment of the present disclosure.

FIGS. 6A-6C are a series of cross-section views of the alternate PCM cell in different states and the flow of electricity therethrough, in accordance with an embodiment of the present disclosure.

FIGS. 7A-7H are a series of cross-section views of a method of manufacturing the alternate PCM cell, in accordance with an embodiment of the present disclosure.

DETAILED DESCRIPTION

Figure 2A:
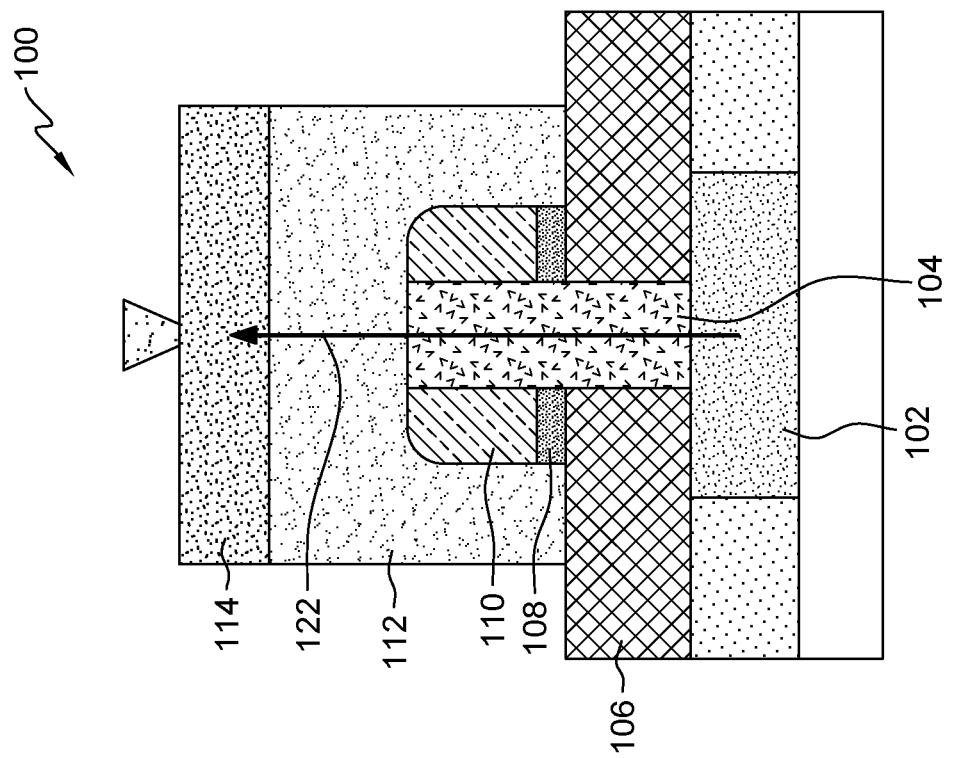
FIGS. 2A-2C are a series of cross-section views of the PCM cell in different states and the flow of electricity therethrough, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1:
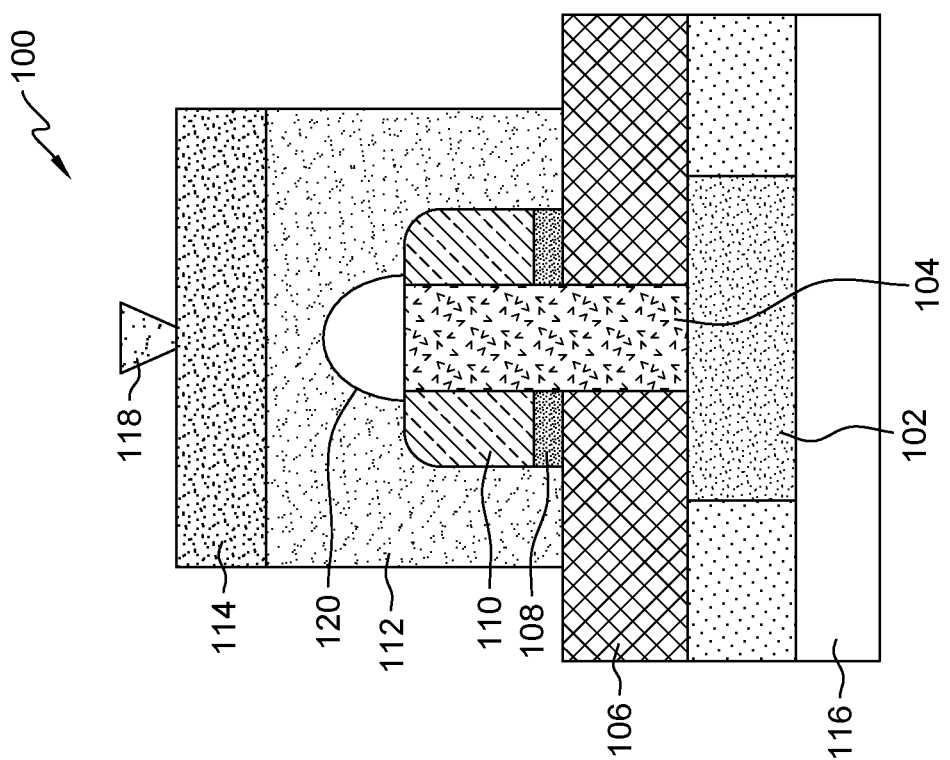
FIG. 1 is a cross-section view of a PCM cell including a resistive liner, in accordance with an embodiment of the present disclosure.

FIG. 1 is a cross-section view of PCM cell 100 for use in, for example, an integrated circuit (not shown). In the illustrated embodiment, PCM cell 100 comprises bottom electrode 102, heater 104, insulator 106, resistive liner 108, spacer 110, PCM material 112, and top electrode 114. Heater 104 is in direct contact with and electrically connected to bottom electrode 102 at the bottom end, and heater 104 extends upwards therefrom to an opposite, upper end. The lower portion of heater 104 is surrounded by insulator 106, which is in direct contact with the sidewall of heater 104 and the top of bottom electrode 102. Insulator 106 is also in direct contact with the bottom side of resistive liner 108, which is in direct contact with and electrically connected to heater 104. Heater 104 extends through resistive liner 108 and spacer 110, which surround and are in direct contact with the sidewall of heater 104. The bottom of spacer 110 is in direct contact with the top of resistive liner 108, and the upper end of heater 104 is coterminous (i.e., flush) with the upper end of spacer 110. PCM material 112 extends over and is in direct contact with spacer 110, resistive liner 108, insulator 106, and heater 104. Thereby, PCM material 112 is electrically connected to the top end of heater 104 and the outer side of resistive liner 108. The top side of PCM material 112 is also in direct contact with and electrically connected to top electrode 114.

In the illustrated embodiment, a cross-section of PCM cell 100 (into the page in FIG. 1) can be square, although in other embodiments, it can be rectangular, oval, circular, or any other suitable shape. In addition, the widths of PCM material 112 and top electrode 114 are the same, whereas the width of heater 104 is substantially reduced, comparatively (e.g., three to seven times smaller, or about five times smaller). Thereby, PCM cell 100 can be said to have a mushroom configuration wherein an electrical current can flow from bottom electrode 102 to top electrode 114 through heater 104, resistive liner 108, and PCM material 112. In addition, PCM cell 100 can be electrically connected to substrate 116 at bottom electrode 102 and to via 118 at top electrode 114. Substrate 116 can be an integrated circuit component such as, for example, a field effect transistor, and via 118 can be, for example, a metal interconnect.

In the illustrated embodiment, bottom electrode 102 and top electrode 114 are comprised of a very electrically conductive material, such as metal or metallic compound, for example, titanium nitride (TiN) or tungsten (W). Heater 104 is an electrode that is comprised of TiN or a higher resistance metal, such as, for example, titanium tungsten (TiW), tantalum nitride (TaN), or titanium aluminide (TiAl), and has a relatively narrow cross-sectional area, which focus electrical current that is run through PCM cell 100. This allows heaters 104 to generate heat through resistive heating during a pulse of electricity, which can be used to selectively change the temperature of PCM material 112, for example, above the crystallization temperature and the melting temperature of PCM material 112. In addition, heater 104 can be comprised of multiple different electrically conductive materials that can be arranged in multiple layers.

In the illustrated embodiment, insulator 106 and spacer 110 are comprised of a dielectric (electrical insulating) material, such as, for example, silicon nitride (SiN), silicon oxide (SiO), or silicon nitride carbide (SiNC). In some embodiments, insulator 106 is the same material as spacer 110, and in other embodiments, insulator 106 is a different material from spacer 110. Resistive liner 108 is comprised of a conductive material having a resistance that is typically higher than commonly used pure metal conductors such as copper (Cu), aluminum (Al), titanium (Ti), gold (Au), or silver (Ag). Such materials can be, for example, aluminum nitride (AlN), boron nitride (BN), aluminum oxide (AlO), TaN, TiN, tungsten nitride (WN), cobalt tungsten (CoW), nickel tungsten (NiW), or yttrium oxide (YO). The resistance of resistive liner 108 is substantially greater than the resistance of the heater 104 (e.g., five to fifty times higher, or about twenty times higher). Furthermore, the resistance of resistive liner 108 is substantially greater than the resistance of PCM material 112 in a low resistance, polycrystalline state (e.g., ten to forty times higher, or about twenty times higher) and substantially lower than the resistance of PCM material 112 in high resistance, amorphous state (e.g., five to fifty times lower, or about ten times lower). The resistivity of resistive liner 108 can be, for example, in the range of 0.1 ohm micrometers ($\Omega$ μm) to 1 kiloohm micrometers (k$\Omega$ μm).

In the illustrated embodiment, PCM material 112 is composed essentially of a phase change material such as a germanium-antimony-tellurium (GST), gallium-antimony-tellurium (GaST), or silver-iridium-antimony-telluride (AIST) material, although other materials can be used as appropriate. Examples of other PCM materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. PCM material 112 may be undoped or doped (e.g., doped with one or more of oxygen (O), nitrogen (N), silicon (Si), or Ti). The terms "composed essentially" and "consist essentially," as used herein with respect to materials of different layers, indicates that other materials, if present, do not materially alter the basic characteristics of the recited materials. For example, a PCM material 112 consisting essentially of GST material does not include other materials that materially alter the basic characteristics of the GST material.

In the illustrated embodiment, PCM cell 100 can be operated as a memory cell by passing an electrical current pulse from bottom electrode 102 to top electrode 114 to program PCM cell 100. This can be done at a variety of voltages and/or for a variety of durations to read or write a value on PCM cell 100. For example, to write, a high voltage can be used (e.g., 1 volt (V) to 4 V) for a short duration, which can cause heater 104 to locally heat PCM material 112 beyond its melting point. Once the flow of current ceases, PCM material 112 can cool down rapidly, which forms amorphous zone 120 in a process called "resetting". Zone 120 is a dome-shaped region of PCM material 112 having an amorphous configuration, although the remainder of PCM material 112 is still in a polycrystalline configuration. In general, this amorphous configuration has no definite structure. However, there can be local, disjoint crystalline nuclei (i.e., small crystallized regions of phase change material 112) present in zone 120. The creation of zone 120 can cause the electrical resistance across PCM cell 100 to increase as compared to a solely polycrystalline configuration (a la PCM cell 100 in FIG. 2A). These resistance values of PCM cell 100 can be read without changing the state of PCM material 112 (including that of zone 120) or the resistance value of PCM cell 100, for example, by sending a current pulse at a low voltage (e.g., 0.2 V) from bottom electrode 102 to top electrode 114.

In addition, PCM material 112 can be rewritten and returned back to a solely polycrystalline configuration by "setting" PCM cell 100. One way to rewrite PCM material 112 uses a high voltage electrical pulse (e.g., 1 V to 4 V) for a short period of time (e.g., 10 nanoseconds (ns)), which can cause PCM material 112 to heat up beyond its crystallization point but not to its melting point. Since the crystallization temperature is lower than the melting temperature, once the flow of current ceases, PCM material 112 can anneal and form crystals. Another way to rewrite PCM material 112 uses an electrical pulse with a relatively long trailing edge (e.g., 1 microsecond) (as opposed to a square pulse with a relatively short trailing edge on the order of nanoseconds) that is strong enough to heat PCM material 112 beyond its melting point, after which, PCM material 112 is cooled down slowly, allowing crystals to form. Either of these processes cause the electrical resistance across PCM cell 100 to decrease as compared to having an amorphous zone 120 (ála PCM cell 100 in FIG. 1). This new resistance value can then be read using current at a low voltage (e.g., 0.2 V) without changing the state of PCM material 112 or the resistance value of PCM cell 100.

In some embodiments, the melting temperature of PCM material 112 is about 600° C. In some embodiments, the crystallization temperature of PCM material 112 is about 180° C. In addition, the process of setting and resetting PCM cell 100 can occur repeatedly, and in some embodiments, different zones 120 with different resistances can be created in PCM materials 112 (e.g., due to having different sizes of zone 120 and/or amounts of crystallization nuclei in zone 120, as shown in FIGS. 2B and 2C). This allows for PCM cell 100 to have various distinct resistances that can be created by varying the resetting parameters. Thereby, if PCM cell 100 is considered to represent information digits, these digits can be non-binary (as opposed to traditional bits). However, in some embodiments, PCM cell 100 can be used as a bit by either having or not having a uniform zone 120 in PCM material 112. In such embodiments, PCM cells 100 can have a high resistance (a.k.a, low voltage output or "0") or low resistance (a.k.a., high voltage output or "1").

The components and configuration of PCM cell 100 allow for the inclusion of resistive liner 108 while still allowing heater 104 to directly contact PCM material 112. This prevents resistive liner 108 from affecting the programming of PCM cell 100 (e.g., changing the set resistance) as would be the case if resistive liner 108 was positioned entirely between heater 104 and PCM material 112. In addition, spacer 110 reduces the contact area between heater 104 and PCM material 112 to only the size of the top of heater 104.

This reduces the amount of contact area between heater 104 and PCM material 112 such that the electricity flowing from heater 104 is concentrated. This allows the electrical pulse to have a low power since there is a smaller area of PCM material 112 that is melted or crystallized during resetting or setting, respectively. This is in contrast to a situation where spacer 110 is absent such that PCM material 112 contacts the top and sides of heater 104 in which the electrical pulse would need a high power to affect the phase of PCM material 112.

Figure 2C:
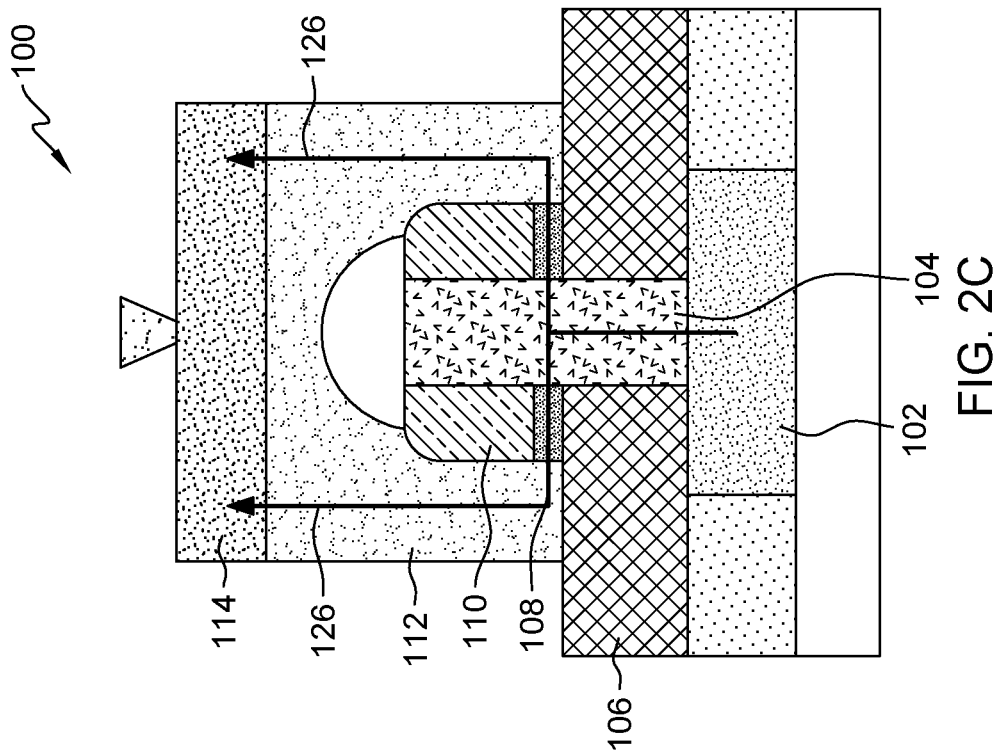
Figure 2B:
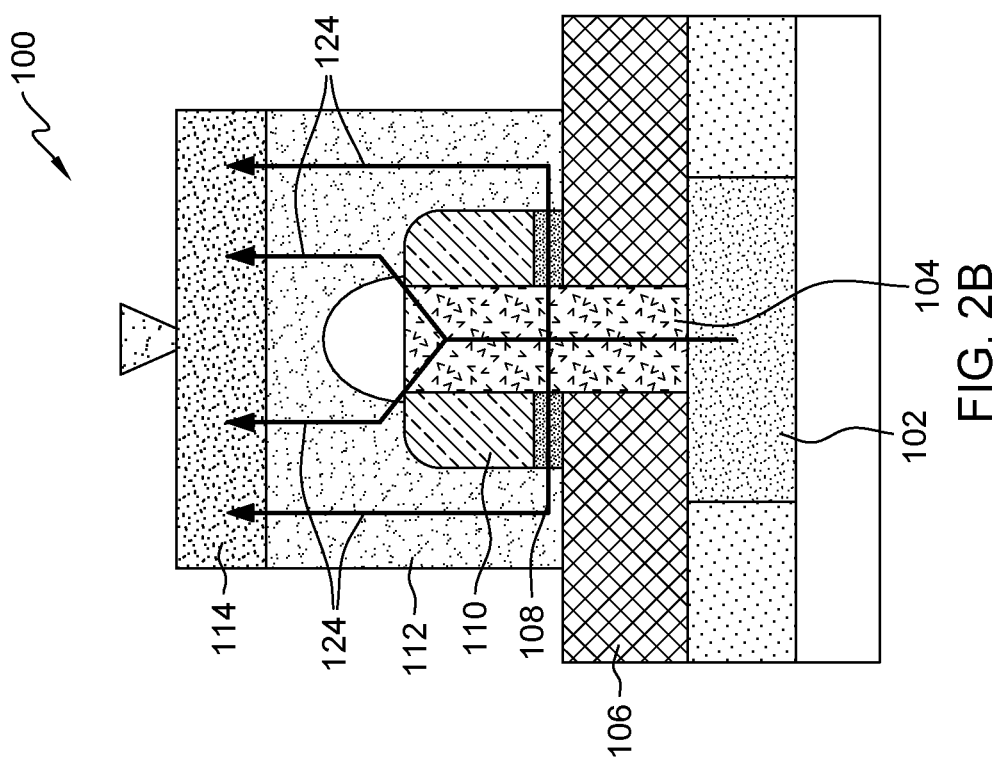
Figure 3A:
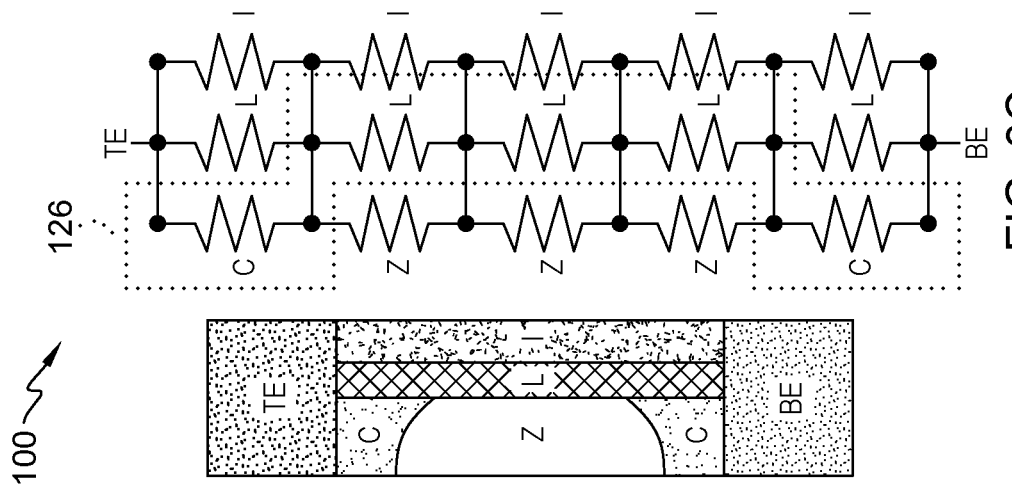
FIGS. 3A-3C are schematic representations of the electrical pathways of FIGS. 2A-2C, respectively, in accordance with an embodiment of the present disclosure.
Figure 3B:
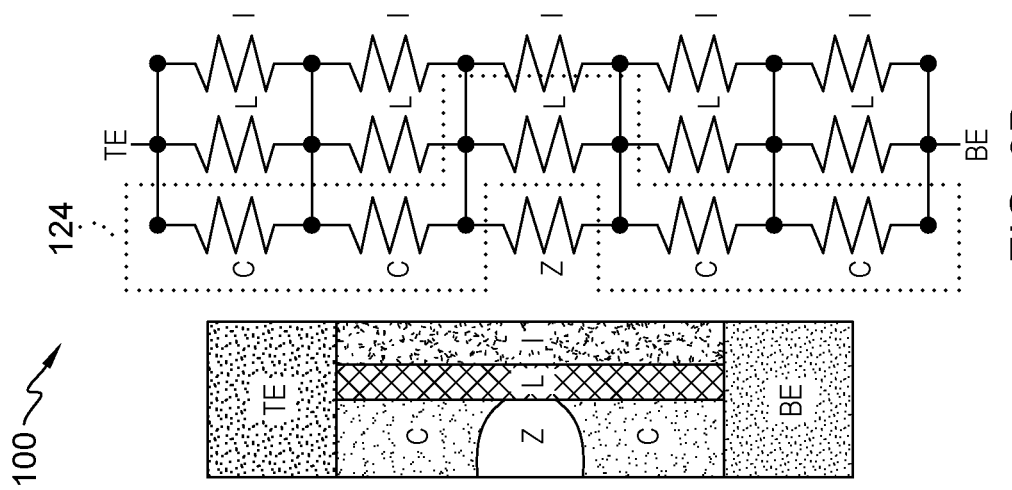
Figure 3C:
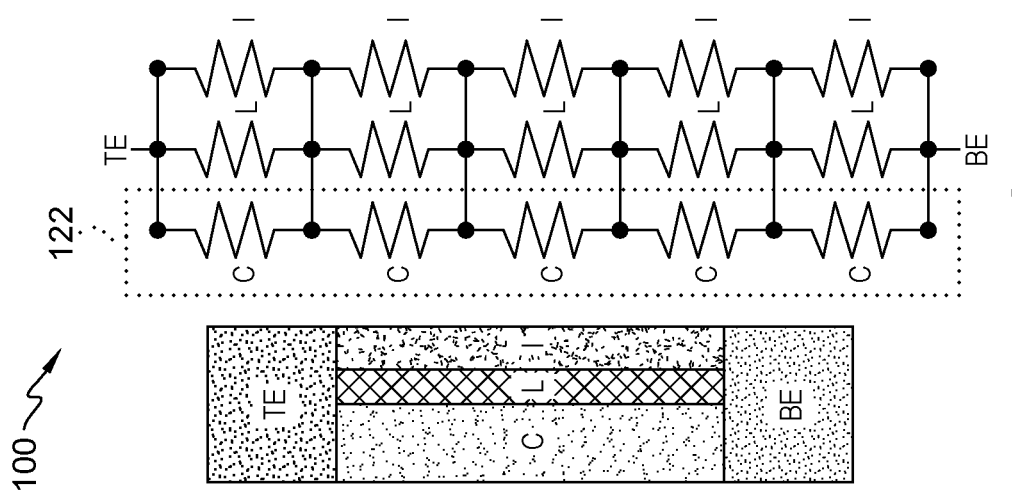

FIGS. 2A-2C are a series of cross-section views of PCM cell 100 in different states and the flow of electricity therethrough. FIGS. 3A-3C are schematic representations of the electrical pathways of FIGS. 2A-2C, respectively. More specifically, PCM material 112 is in a solely polycrystalline configuration in FIGS. 2A and 3A, PCM material 112 has a small amorphous zone 120 in FIGS. 2B and 3B, and PCM material 112 has a large amorphous zone 120 in FIGS. 2C and 3C. Therefore, FIGS. 2A-2C and 3A-3C will be discussed in conjunction with one another.

In the illustrated embodiments, the electrical resistance of resistive liner 108 is between the electrical resistance of PCM material 112 in a polycrystalline phase and the electrical resistance of PCM material 112 in an amorphous phase (a la zone 120). For example, the resistance of an amorphous phase PCM material 112 can be one hundred times greater than the resistance of a crystalline phase PCM material 112. In such an embodiment, the resistance of resistive liner 108 can be, for example, between ten and forty times greater than the resistance of a crystalline phase PCM material 112. In some embodiments, the resistance of resistive liner 108 can be, for example, about twenty times greater than the resistance of a crystalline phase PCM material 112. For example, if the crystalline resistance of PCM material 112 can be between 10 kΩ and 100 kΩ, then the amorphous resistance of PCM material 112 can be between 1 megaohm (MΩ) and 10 MΩ, and the resistance of resistive liner 108 can be between 200 kΩ and 2 MΩ.

As is well-known in the art, electricity will flow through all available paths. When a set of parallel paths have similar resistances, then electricity will flow through them in similar quantities. However, if the paths have significantly different resistances, then the electricity will flow through the lower resistance path(s) in greater quantity. In such a situation, the overall resistance of the set of parallel paths will be dominated by the resistance of the lower resistance path(s).

In the illustrated embodiment of FIG. 2A, PCM material 112 is solely in a polycrystalline phase. Because heater 104 is a conductive material and insulator 106 is not, an electrical pulse will mostly flow along path 122 from bottom electrode 102 and through heater 104. Because crystalline PCM material 112 is a better conductor than resistive liner 108, path 122 extends straight through PCM material 112 to top electrode 114. The reason that path 122 is the dominant electrical pathway is shown in FIG. 3A. FIG. 3A depicts PCM cell 100 as a physical schematic on the left and an electrical schematic on the right. As stated above, the electrical pulse travels from bottom electrode BE to top electrode TE, and the resistance of crystallized PCM material C is lower than that of resistive liner L and insulator I. Therefore, path 122 extends through PCM material C.

In the illustrated embodiment of FIG. 2B, PCM material 112 includes a small amorphous zone 120. Because heater 104 is a conductive material and insulator 106 is not, an electrical pulse will mostly flow along path 124 from bottom electrode 102 and through heater 104. Because crystalline PCM material 112 and resistive liner 108 are better conductors than amorphous zone 120, path 124 avoids traveling through the bulk of amorphous zone 120. Instead, path 124 forks such that some of path 124 goes through resistive liner 108 and the crystalline portion of PCM material 112 to top electrode 114, and some of path 124 goes through a short portion of amorphous zone 120 and the crystalline portion of PCM material 112 to top electrode 114. The reason that path 124 is the dominant electrical pathway is shown in FIG. 3B. FIG. 3B depicts PCM cell 100 as a physical schematic on the left and an electrical schematic on the right. As stated above, the electrical pulse travels from bottom electrode BE to top electrode TE. The resistance of crystallized PCM material C is lower than that of resistive liner L, insulator I, and zone Z, and the resistance of resistive liner L is lower than that of zone Z. Therefore, path 124 extends mainly through resistive liner L and PCM material C.

In the illustrated embodiment of FIG. 2C, PCM material 112 includes a large amorphous zone 120. Because heater 104 is a conductive material and insulator 106 is not, an electrical pulse will mostly flow along path 126 from bottom electrode 102 and through heater 104. Because crystalline PCM material 112 and resistive liner 108 are better conductors than amorphous zone 120, path 126 avoids traveling through the bulk of amorphous zone 120. Since amorphous zone 120 is so large, path 126 avoids amorphous zone 120 entirely, so it extends through resistive liner 108 and crystalline PCM material 112 to top electrode 114. The reason that path 126 is the dominant electrical pathway is shown in FIG. 3C. FIG. 3C depicts PCM cell 100 as a physical schematic on the left and an electrical schematic on the right. As stated above, the electrical pulse travels from bottom electrode BE to top electrode TE. The resistance of crystallized PCM material C is lower than that of resistive liner L, insulator I, and zone Z, and the resistance of resistive liner L is lower than that of zone Z. Therefore, path 124 extends mainly through resistive liner L and PCM material C.

The result of paths 122-126 being different from each other when PCM cell 100 is in different states is that the effect of resistance drift in PCM material 112 (e.g., in zone 120) is diluted by resistive liner 108. This is because the resistance of resistive liner 108 is constant, whereas the resistance of PCM material 112 can change over time (e.g., by the size of amorphous zone 120 changing over time).

Figure 4D:
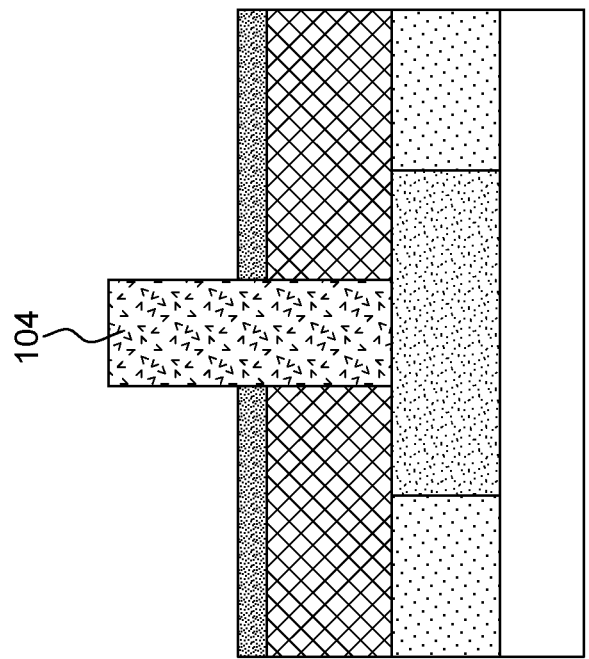
Figure 4C:
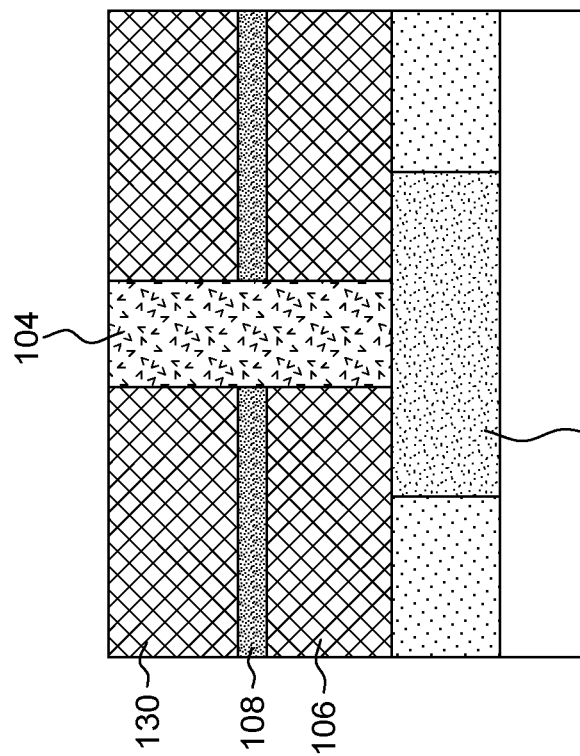

FIGS. 4A-4G are a series of cross-section views of a method of manufacturing PCM cell 100. In FIG. 4A, substrate 116 is provided, and bottom electrode 102 is formed on substrate 116. In addition, dielectric 128 is formed on substrate 116 to electrically insulate bottom electrode 102 from other components as needed. Substrate 116 may be composed of any suitable semiconductor material. For example, substrate 116 may be formed with any type of semiconductor substrate or wafer including, but not limited to, silicon, silicon germanium, a group IV semiconductor material, a group III-V semiconductor material, a group II-VI semiconductor material, a silicon on insulator (SOI), or other known semiconductor material used in semiconductor chips. In some embodiments, substrate 116 includes one or more semiconductor devices, such as transistors, isolation trenches, contacts, and the like. In some embodiments, bottom electrode 102 resides on a semiconductor device or a contact in semiconductor substrate 116. In some embodiments, bottom electrode connects to a contact (not shown) which extends through an inter-level dielectric (not shown) to underlying access circuitry or transistors in substrate 116 (not shown). In FIG. 4B, insulator 106, resistive liner 108, and dielectric 130 are formed on bottom electrode 102 and dielectric 128. In FIG. 4C, a via is formed through dielectric 130, resistive liner 108, and insulator 106 (down to bottom electrode 102). This via is then filled to form heater 104. In FIG. 4D, dielectric 130 is removed to expose resistive liner 108 and a portion of the sidewalls and the upper end of heater 104.

Figure 4F:
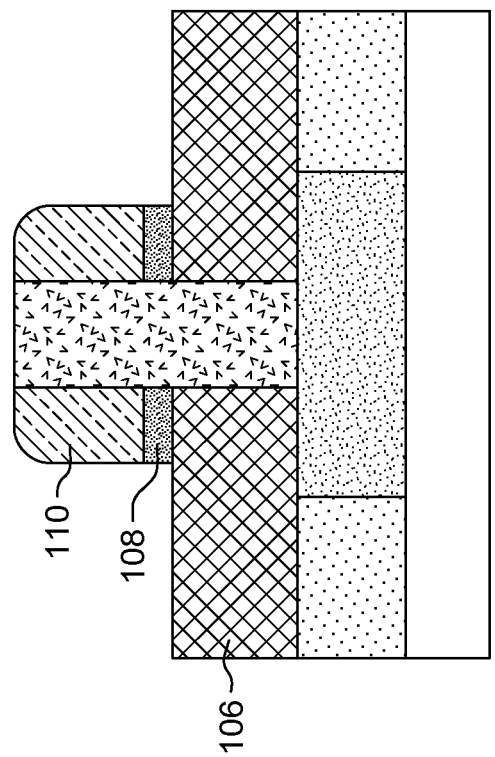
Figure 4E:
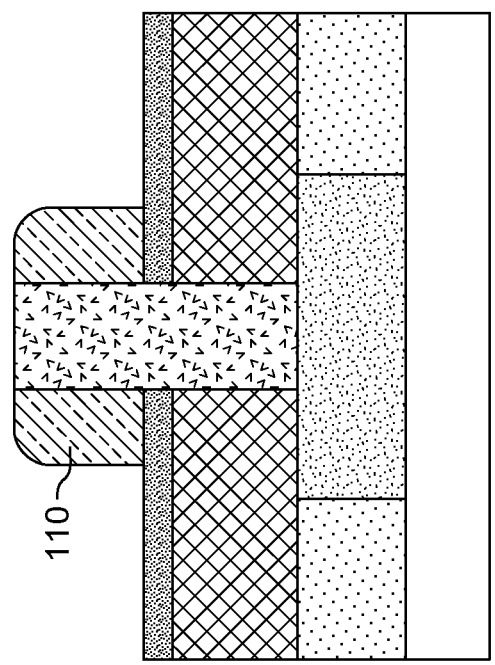
Figure 4G:
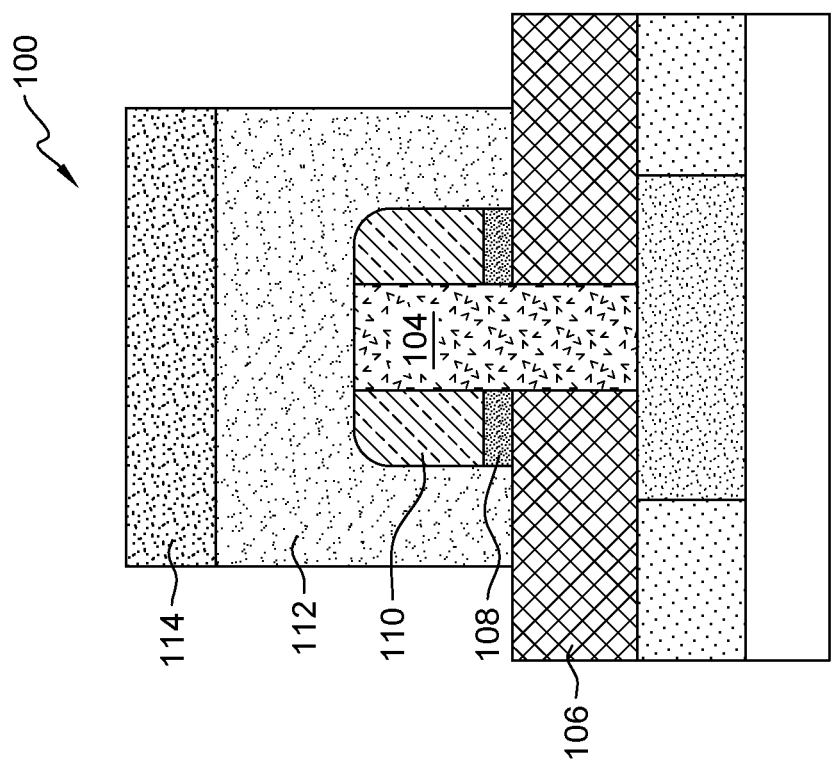

In FIG. 4E, spacer 110 is formed, for example, by depositing a layer of spacer material, masking the spacer material, and using RIE to remove the excess spacer material. In some embodiments, insulator 106, spacer 110, dielectric 128, and dielectric 130 are comprised of the same material, and in other embodiments, some or all of them are different from each other. In FIG. 4F, the portion of resistive liner 108 that is not beneath spacer 110 is removed to expose a portion of insulator 106. In some embodiments, this occurs during the RIE process used in FIG. 4E to form spacer 110. In FIG. 4G, PCM material 112 and top electrode 114 are formed on heater 104, insulator 106, resistive liner 108, and spacer 110. This can be done, for example, using one or more masks and RIE processes.

Thereby, PCM cell 100 can be fabricated such that resistive liner 108 is only present under a portion of PCM material 112 and does not require an additional mask to be formed to its final size (since spacer 110 is present). Furthermore, forming spacer 110 allows for the height of heater 104 to not be as critical as in some other embodiments. In some of these other embodiments, for example, the top of heater 104 can be flush with the top of resistive liner 108. In such embodiments, the sidewalls of heater 104 are not in contact with PCM material 112 despite not having spacer 110 present. However, since resistive liner 108 may be very thin (e.g., 1 nanometer (nm) to 10 nm), planarizing heater 104 to be flush with resistive liner 108 could be difficult without removing some of resistive liner 108.

Figure 5:
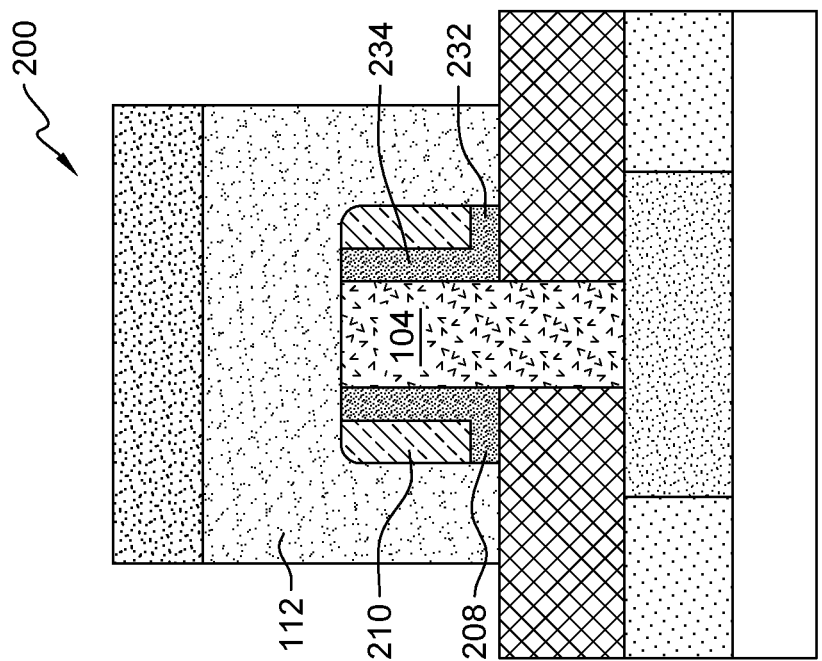
FIG. 5 is a cross-section view of an alternate PCM cell with an alternate resistive liner, in accordance with an embodiment of the present disclosure.

FIG. 5 is a cross-section view of an alternate PCM cell 200. In the illustrated embodiment, PCM cell 200 is similar to PCM cell 100 (shown in FIG. 1) except that resistive liner 208 contacts PCM material 112 along the outer side and the top side and spacer 210 is correspondingly different. Thereby, the same reference numerals will be used for PCM cell 200 where the corresponding components are the same as in PCM cell 100. However, reference numerals that are one hundred higher are used for components of PCM cell 200 that are different from those in PCM cell 100.

In the illustrated embodiment, resistive liner 208 has an L-shaped cross-section with leg 232 extending outward from heater 104 and leg 234 extending along the sidewall of heater 104 and. Thereby, the top side of leg 234, which is flush with the tops of spacer 210 and heater 104, is in direct contact with and electrically connected to PCM material 112, and the outer side of leg 232 is in direct contact with and electrically connected to PCM material 112.

FIGS. 6A-6C are a series of cross-section views of PCM cell 200 in different states and the flow of electricity therethrough. In the illustrated embodiment of FIG. 6A, PCM material 112 is solely in a polycrystalline phase. Because heater 104 is a conductive material and insulator 106 is not, an electrical pulse will mostly flow along path 222 from bottom electrode 102 and through heater 104. Because crystalline PCM material 112 is a better conductor than resistive liner 208, path 222 extends straight through PCM material 112 to top electrode 114.

In the illustrated embodiment of FIG. 6B, PCM material 112 includes a small amorphous zone 120. Because heater 104 is a conductive material and insulator 106 is not, an electrical pulse will mostly flow along path 224 from bottom electrode 102 and through heater 104. Because crystalline PCM material 112 and resistive liner 208 are better conductors than amorphous zone 120, path 224 avoids traveling through the bulk of amorphous zone 120. Instead, path 224 forks such that some of path 224 goes through leg 234 and the crystalline portion of PCM material 112 to top electrode 114, some of path 224 goes through leg 232 and the crystalline portion of PCM material 112 to top electrode 114, and some of path 224 goes through a short portion of zone 120 and the crystalline portion of PCM material 112 to top electrode 114.

In the illustrated embodiment of FIG. 6C, PCM material 112 includes a large amorphous zone 120. Because heater 104 is a conductive material and insulator 106 is not, an electrical pulse will mostly flow along path 226 from bottom electrode 102 and through heater 104. Because crystalline PCM material 112 and resistive liner 208 are better conductors than amorphous zone 120, path 226 avoids traveling through the bulk of amorphous zone 120. Since amorphous zone 120 is so large, path 226 avoids amorphous zone 120, so it extends through leg 232 of resistive liner 208 and crystalline PCM material 112 to top electrode 114.

The result of paths 222-226 being different when PCM cell 200 is in different states is that the effect of resistance drift in PCM material 112 (e.g., in zone 120) is diluted by resistive liner 208. This is because the resistance of resistive liner 208 is constant, whereas the resistance of PCM material 112 can change over time (e.g., by the size of zone 120 changing over time).

Figure 7C:
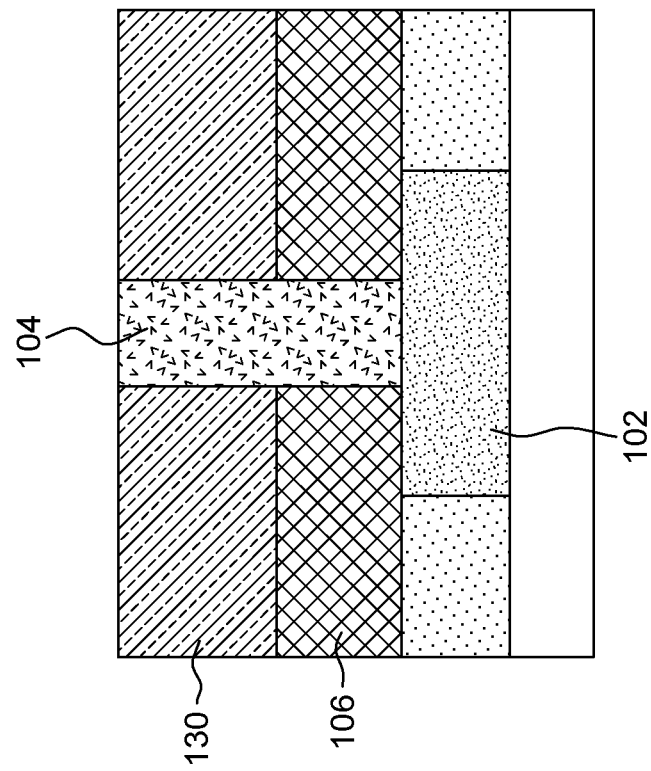
Figure 7B:
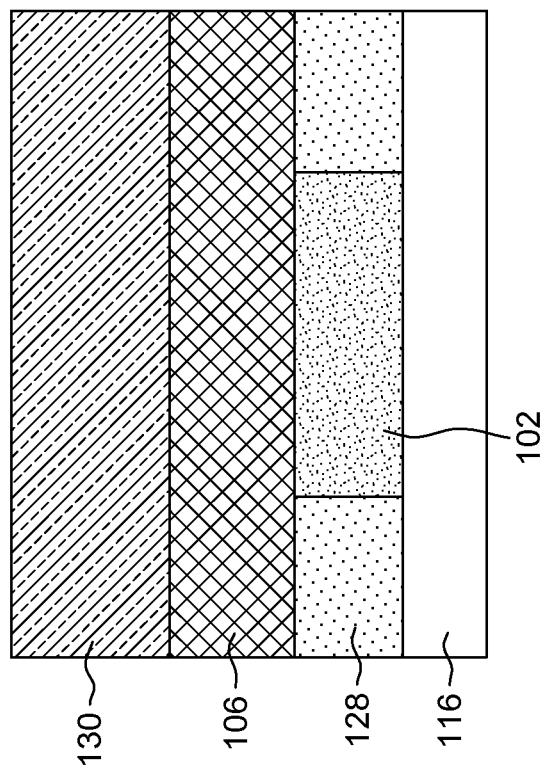
Figure 7E:
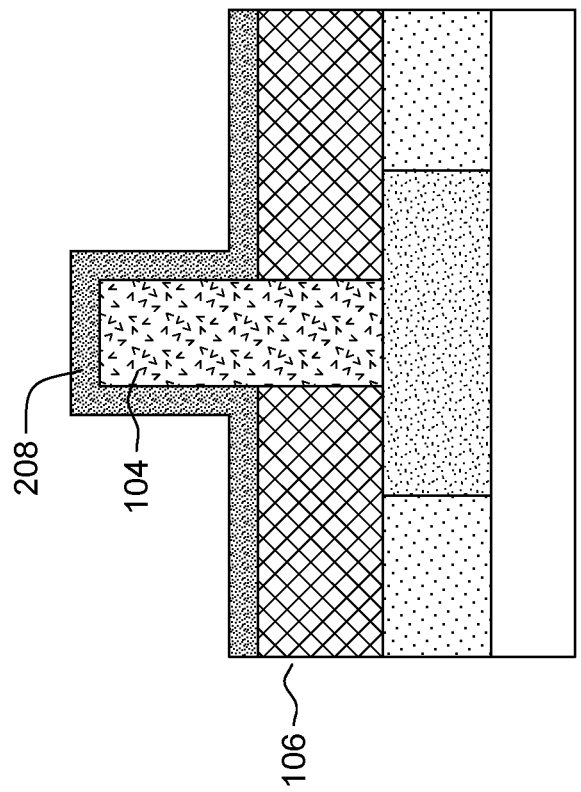
Figure 7D:
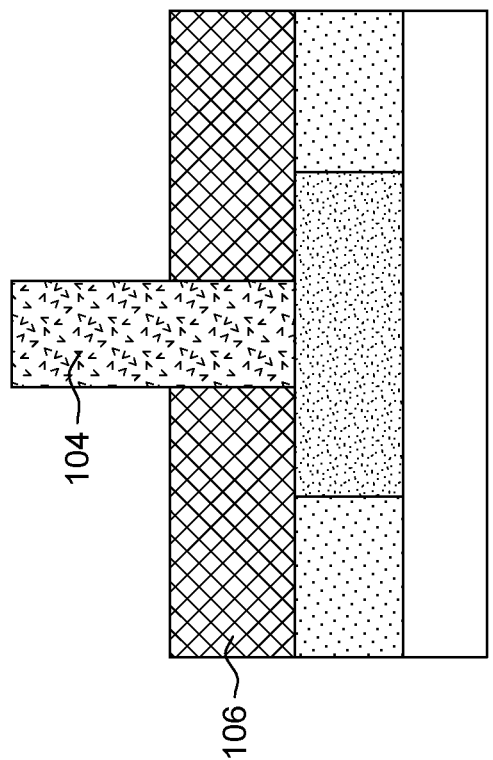

FIGS. 7A-7H are a series of cross-section views of a method of manufacturing PCM cell 200. In FIG. 7A, substrate 116 is provided, and bottom electrode 102 is formed on substrate 116. In addition, dielectric 128 is formed on substrate 116 to electrically insulate bottom electrode 102 from other components as needed. In FIG. 7B, insulator 106 and dielectric 130 are formed on bottom electrode 102 and dielectric 128. In some embodiments, insulator 106 and dielectric 130 are comprised of the same material, and in other embodiments, they are comprised of different materials. In the latter such embodiments, only a single, thick layer of insulator 106 can be deposited (without a second deposit of dielectric 130). In FIG. 7C, a via is formed through dielectric 130 and insulator 106 (down to bottom electrode 102). This via is then filled to form heater 104. In FIG. 7D, dielectric 130 is removed to expose insulator 106 and a portion of the sidewalls and the upper end of heater 104. In an embodiment where insulator 106 is a thick layer that takes the place of dielectric 130, a depth-controlled etch (e.g., a timed recess etch) can be performed to reduce insulator 106 to its final thickness.

Figure 7F:
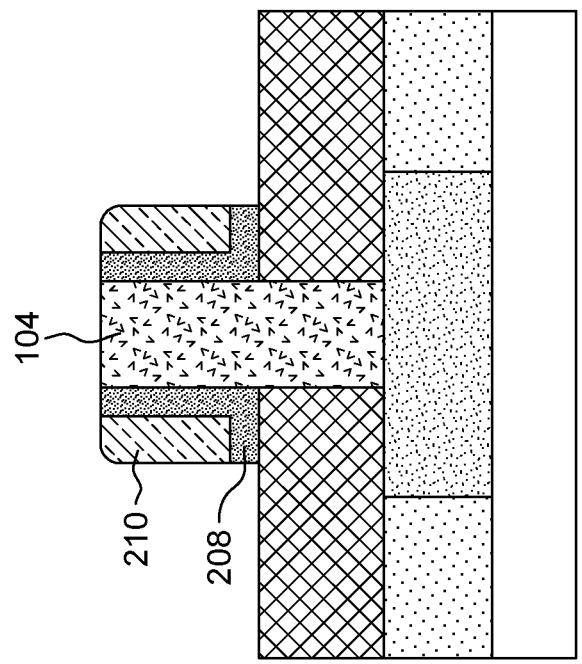
Figure 7G:
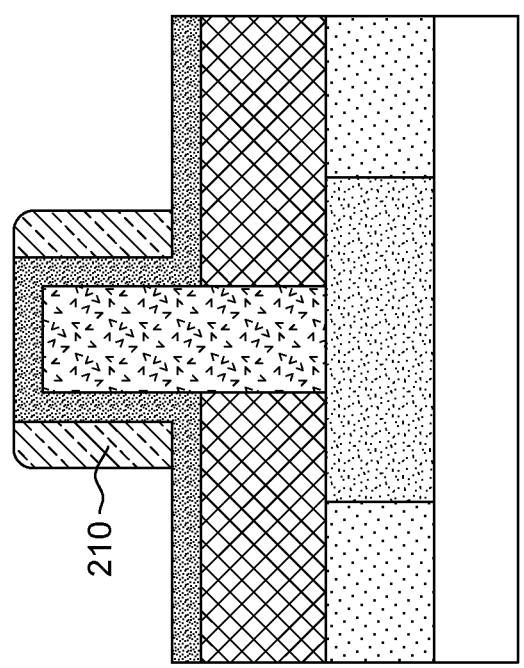
Figure 7H:
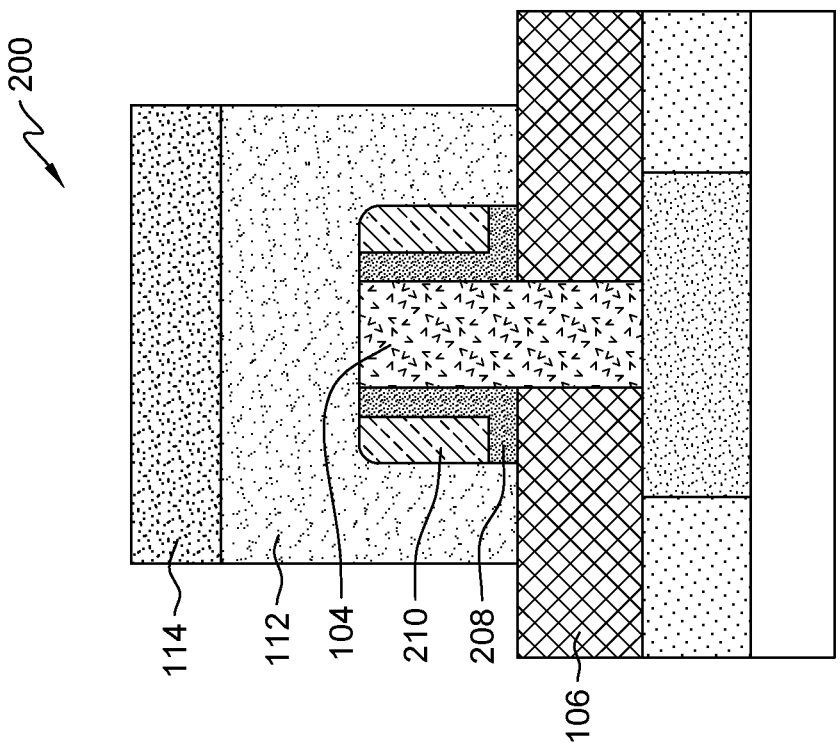

In FIG. 7E, resistive liner 208 is formed on insulator 106 and the sidewall and top of heater 104. In FIG. 7F, spacer 210 is formed, for example, by depositing a layer of spacer material, masking the spacer material, and using RIE to remove the excess spacer material. In some embodiments, insulator 106, spacer 210, dielectric 128, and dielectric 130 are comprised of the same material, and in other embodiments, some or all of them are different from each other. In FIG. 7G, the portion of resistive liner 208 that is not beneath spacer 210 is removed to expose a portion of insulator 206 and the top of heater 104. In addition, the top of spacer 210 is planarized to be flush with the tops of heater 104 and resistive liner 208. In FIG. 7H, PCM material 112 and top electrode 114 are formed on heater 104, insulator 106, resistive liner 208, and spacer 210. This can be done, for example, using one or more masks and RIE processes.

Thereby, PCM cell 200 can be fabricated such that resistive liner 208 is only present under a portion of PCM material 112 and does not require an additional mask to be formed to its final size (since spacer 210 is present). Furthermore, forming spacer 210 allows for the height of heater 104 to not be as critical as in some other embodiments.

Figure 8:
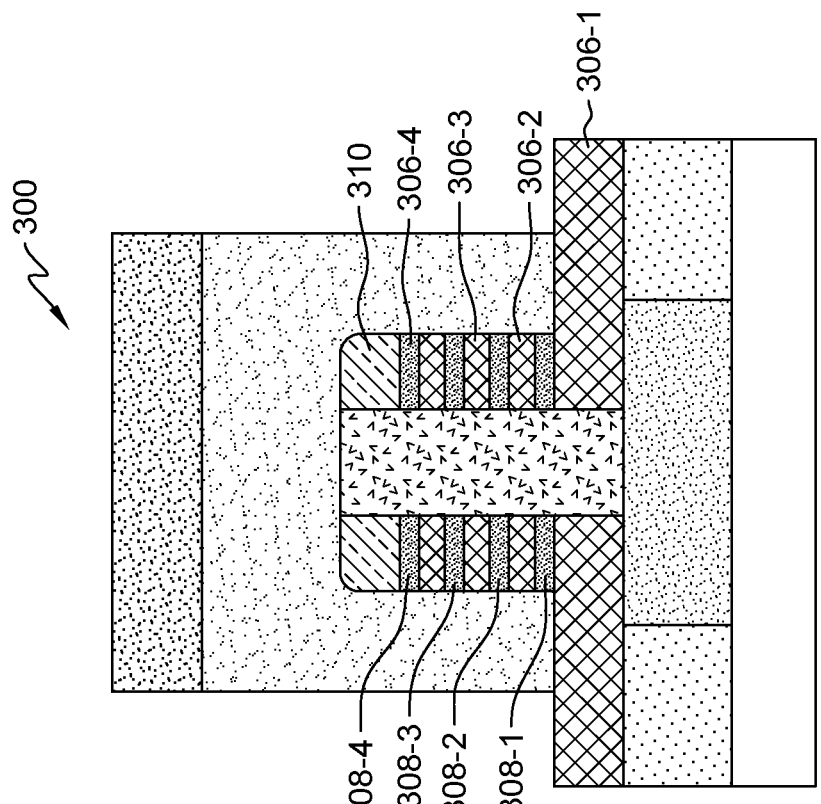
FIG. 8 is a cross-section view of another alternate PCM cell with another alternate resistive liner, in accordance with an embodiment of the present disclosure.

FIG. 8 is a cross-section view of PCM cell 300 with insulators 306-1-306-4 (collectively "insulators 306") and resistive liners 308-1-308-4 (collectively "resistive liners 308"). In the illustrated embodiment, PCM cell 300 is similar to PCM cell 100 (shown in FIG. 1) except that there are multiple resistive liners 308 and multiple insulators 306, and spacer 310 is correspondingly different as well. Thereby, the same reference numerals will be used for PCM cell 300 where the corresponding components are the same as in PCM cell 100. However, reference numerals that are two hundred higher are used for components of PCM cell 300 that are different from those in PCM cell 100.

In the illustrated embodiment, each resistive liner 308 is directly in contact with and electrically connected to heater 104 and PCM material 112, although each resistive liner 308 is not directly in contact with any other resistive liner 308. Instead, resistive liners 308 are spaced apart from each other by insulators 306. While there are four insulators 306 and four resistive liners 308 shown in FIG. 8, there can be greater or fewer insulators 306 and resistive liners 308 in other embodiments.

The multiple insulators 306 and resistive liners 308 can be formed, for example, by adding multiple, alternating layers during a step similar to that depicted in FIG. 4B. In some embodiments, insulators 306 are comprised of a different material than that of spacer 310, such that spacer 310 is not etched during a process that removes the portions of insulators 306-2-306-4 and resistive liners 308-1-308-4 to expose some of insulator 306-1 during a step similar to that depicted in FIG. 4F.

While resistive liners 308 function the same as a single resistive liner 108 (shown in FIG. 1), having multiple resistive liners 308 allows for a greater choice of materials for resistive liners 308. For example, if a particular total resistance is sought, then a higher resistance material can be used as compared with an embodiment with only a single resistive liner 108. This is because multiple resistive liners 308 act as resistors in parallel, which can lower the overall resistance. Thereby, if a particular material is desired to be used, then the number of insulators 306 and resistive liners 308 can be set accordingly.

Figure 9:
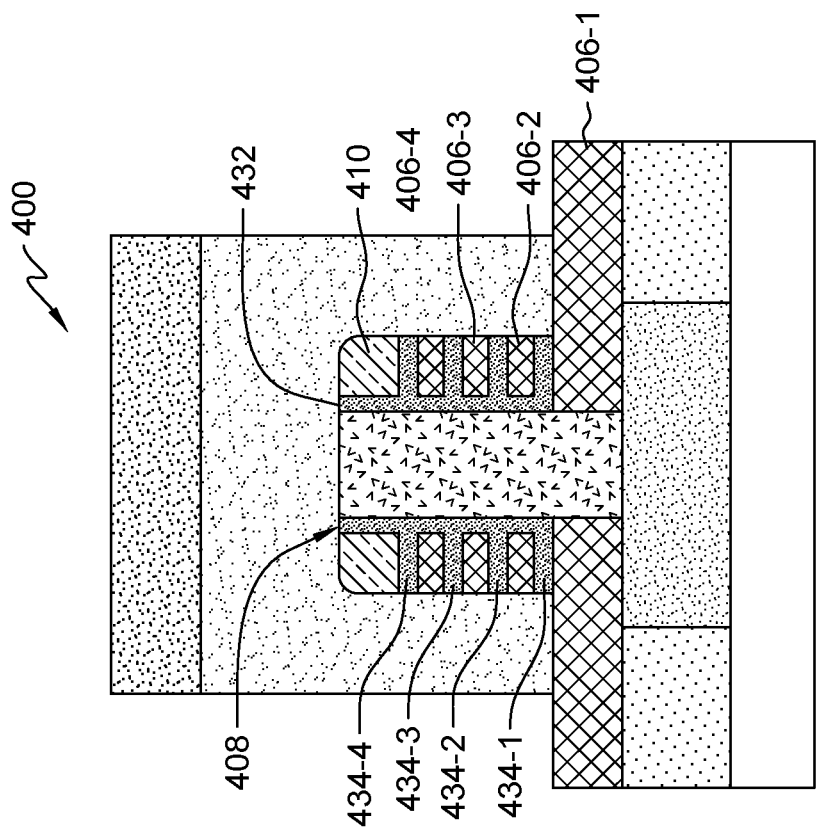
FIG. 9 is a cross-section view of another alternate PCM cell with another alternate resistive liner, in accordance with an embodiment of the present disclosure.

FIG. 9 is a cross-section view of PCM cell 400 with insulators 406-1-406-4 (collectively "insulators 406") and resistive liner 408. In the illustrated embodiment, PCM cell 400 is similar to PCM cell 200 (shown in FIG. 5) except that there are multiple legs 434-1-434-4 (collectively "legs 434") of resistive liner 408 that are spaced apart from one another by multiple insulators 406-1-406-4 (collectively "insulators 406"), and spacer 410 is correspondingly different as well. Thereby, the same reference numerals will be used for PCM cell 400 where the corresponding components are the same as in PCM cell 200. However, reference numerals that are two hundred higher are used for components of PCM cell 400 that are different from those in PCM cell 200.

In the illustrated embodiment, resistive liner 408 has a finned cross-section with leg 432 extending along the sidewall of heater 104 and legs 434 extending outward from heater 104. Thereby, the top side of leg 432, which is flush with the tops of spacer 410 and heater 104, is in direct contact with and electrically connected to PCM material 112, and the outer sides of legs 434 are in direct contact with and electrically connected to PCM material 112. While there are four insulators 406 and four legs 434 shown in FIG. 9, there can be greater or fewer insulators 406 and legs 434 in other embodiments.

The multiple insulators 406 and resistive liner 408 can be formed, for example, by adding multiple, alternating layers (a la FIG. 4B) after a step similar to that depicted in FIG. 7E. In some embodiments, insulators 406 are comprised of a different material than that of spacer 410, such that spacer 410 is not etched during a process that removes the portions of insulators 306-2-306-4 and resistive liner 408 to expose some of insulator 406-1 during a step similar to that depicted in FIG. 7G.

While resistive liner 408 functions the same as resistive liner 208 (shown in FIG. 5), having multiple legs 434 allows for a greater choice of materials for resistive liner 408. For example, if a particular total resistance is sought, then a higher resistance material can be used as compared with an embodiment with only two legs 232 and 234 (a la resistive liner 208). This is because multiple legs 434 act as resistors in parallel, which can lower the overall resistance of resistive liner 408. Thereby, if a particular material is desired to be used, then the number of insulators 306 and legs 434 can be set accordingly.

Further Discussion of Some Exemplary Embodiments

The following are non-exclusive descriptions of some exemplary embodiments of the present disclosure.

A PCM cell, according to an exemplary embodiment of this disclosure, among other possible things, includes: a first electrode; a heater electrically connected to the first electrode; a PCM material electrically connected to the heater; a second electrode electrically connected to the PCM material; and a resistive liner in direct contact with and electrically connected to a sidewall of the heater and to the PCM material.

The PCM cell of the preceding paragraph can optionally include, additionally and/or alternatively, any one or more of the following features, configurations, and/or additional components:

A further embodiment of the foregoing PCM cell, wherein the PCM material is in direct contact with an end of the heater.

A further embodiment of any of the foregoing PCM cells, further comprising: an electrical insulating spacer in direct contact with the sidewall of the heater and with a portion of the resistive liner such that the resistive liner is only in direct contact with the PCM material at an outer end of the resistive liner opposite of the heater.

A further embodiment of any of the foregoing PCM cells, further comprising: an electrical insulating layer between and in direct contact with the first electrode and the resistive liner.

A further embodiment of any of the foregoing PCM cells, wherein: a width of the PCM material is three to seven times a width of the heater.

A method of manufacturing a PCM cell, according to an exemplary embodiment of this disclosure, among other possible things, includes: forming a first electrode; forming a first electrical insulating layer on the first electrode; forming a resistive liner on the first electrical insulating layer; forming a heater that extends from the first electrode and through the first electrical insulating layer and the resistive liner; forming a PCM material on the heater and the resistive liner; and forming a second electrode on the PCM material.

The method of the preceding paragraph can optionally include, additionally and/or alternatively, any one or more of the following features, configurations, and/or additional components:

A further embodiment of the foregoing method, further comprising: forming a second electrical insulating layer on the resistive liner; wherein the heater extends through the second electrical insulating layer.

A further embodiment of any of the foregoing methods, further comprising: removing the second electrical insulating layer after forming the heater.

A further embodiment of any of the foregoing methods, further comprising: removing a portion of the resistive liner to expose a portion of the first electrical insulating layer.

A further embodiment of any of the foregoing methods, further comprising: forming a dielectric spacer on the resistive liner around the heater prior to removing the portion of the resistive liner.

A PCM cell, according to an exemplary embodiment of this disclosure, among other possible things, includes: a first electrode; a heater in direct contact with and electrically connected to the first electrode; a PCM material in direct contact with and electrically connected to the heater; a second electrode in direct contact with and electrically connected to the PCM material; and a first resistive liner in direct contact with and electrically connected to the heater and to the PCM material.

The PCM cell of the preceding paragraph can optionally include, additionally and/or alternatively, any one or more of the following features, configurations, and/or additional components:

A further embodiment of the foregoing PCM cell, further comprising: a dielectric spacer surrounding the heater and on a portion of the first resistive liner such that the heater is only in direct contact with the PCM material at an end of the heater opposite of the first electrode, and the first resistive liner is only in direct contact with the PCM material at an outer end of the first resistive liner opposite of the heater.

A further embodiment of any of the foregoing PCM cells, further comprising: an electrical insulating layer between and in direct contact with the first electrode and the first resistive liner.

A further embodiment of any of the foregoing PCM cells, further comprising: a second resistive liner in direct contact with and electrically connected to the heater and to the PCM material, wherein the second resistive liner is spaced apart from the first resistive liner.

A further embodiment of any of the foregoing PCM cells, further comprising: an electrical insulating layer between the first resistive liner and the second resistive liner.

A PCM cell, according to an exemplary embodiment of this disclosure, among other possible things, includes: a first electrode; a heater electrically connected to the first electrode; a PCM material electrically connected to the heater; a second electrode electrically connected to the PCM material; and a resistive liner in direct contact with and electrically connected to a sidewall of the heater, wherein the resistive liner has an L-shaped cross-section with a first leg extending along the sidewall of the heater and a second leg extending outward from the heater.

The PCM cell of the preceding paragraph can optionally include, additionally and/or alternatively, any one or more of the following features, configurations, and/or additional components:

A further embodiment of the foregoing PCM cell, further comprising: a dielectric spacer positioned over a portion of the resistive liner such that the resistive liner is only in direct contact with the PCM material at a first end of the first leg and a second end of the second leg.

A further embodiment of any of the foregoing PCM cells, further comprising: an electrical insulating layer between and in direct contact with the first electrode and the resistive liner.

A further embodiment of any of the foregoing PCM cells, wherein the resistive liner further comprises: a third leg extending outward from the heater and spaced apart from the second leg.

A further embodiment of any of the foregoing PCM cells, further comprising: an electrical insulating layer between the second leg and the third leg.

A method of manufacturing a PCM cell, according to an exemplary embodiment of this disclosure, among other possible things, includes: forming a first electrode; forming a first electrical insulating layer on the first electrode; forming a heater that extends from the first electrode and through the first electrical insulating layer; forming a resistive liner on the first electrical insulating layer and on a portion of the heater such that a portion of the heater is not covered by the resistive liner; forming a PCM material on the heater and the resistive liner; and forming a second electrode on the PCM material.

The method of the preceding paragraph can optionally include, additionally and/or alternatively, any one or more of the following features, configurations, and/or additional components:

A further embodiment of the foregoing method, wherein forming the resistive liner comprises: forming the resistive liner over the heater; and removing a portion of the resistive liner to expose a portion of the heater.

A further embodiment of any of the foregoing methods, further comprising: removing a portion of the resistive liner to expose a portion of the first electrical insulating layer.

A further embodiment of any of the foregoing methods, further comprising: forming a dielectric spacer on the resistive liner around the heater prior to removing the portion of the resistive liner.

A further embodiment of any of the foregoing methods, further comprising: forming a second electrical insulating layer on the first electrical insulating layer prior to forming the heater.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) cell comprising:
   a first electrode;
   a heater electrically connected to the first electrode;
   a PCM material electrically connected to the heater;
   a second electrode electrically connected to the PCM material; and
   a resistive liner in direct contact with and electrically connected to a sidewall of the heater and to the PCM material.

2. The PCM cell of claim 1, wherein the PCM material is in direct contact with an end of the heater.

3. The PCM cell of claim 2, further comprising:
an electrical insulating spacer in direct contact with the sidewall of the heater and with a portion of the resistive liner such that the resistive liner is only in direct contact with the PCM material at an outer end of the resistive liner opposite of the heater.

4. The PCM cell of claim 1, further comprising:
an electrical insulating layer between and in direct contact with the first electrode and the resistive liner.

5. The PCM cell of claim 4, wherein a width of the PCM material is three to seven times a width of the heater.

6. A method of manufacturing a phase change memory (PCM) cell, the method comprising:
forming a first electrode;
forming a first electrical insulating layer on the first electrode;
forming a resistive liner on the first electrical insulating layer;
forming a heater that extends from the first electrode and through the first electrical insulating layer and the resistive liner;
forming a PCM material on the heater and the resistive liner; and
forming a second electrode on the PCM material.

7. The method of claim 6, further comprising:
forming a second electrical insulating layer on the resistive liner;
wherein the heater extends through the second electrical insulating layer.

8. The method of claim 7, further comprising:
removing the second electrical insulating layer after forming the heater.

9. The method of claim 8, further comprising:
removing a portion of the resistive liner to expose a portion of the first electrical insulating layer.

10. The method of claim 9, further comprising:
forming a dielectric spacer on the resistive liner around the heater prior to removing the portion of the resistive liner.

11. A phase change memory (PCM) cell comprising:
a first electrode;
a heater in direct contact with and electrically connected to the first electrode;
a PCM material in direct contact with and electrically connected to the heater;
a second electrode in direct contact with and electrically connected to the PCM material; and
a first resistive liner in direct contact with and electrically connected to the heater and to the PCM material.

12. The PCM cell of claim 11, further comprising:
a dielectric spacer surrounding the heater and on a portion of the first resistive liner such that the heater is only in direct contact with the PCM material at an end of the heater opposite of the first electrode, and the first resistive liner is only in direct contact with the PCM material at an outer end of the first resistive liner opposite of the heater.

13. The PCM cell of claim 11, further comprising:
an electrical insulating layer between and in direct contact with the first electrode and the first resistive liner.

14. The PCM cell of claim 11, further comprising:
a second resistive liner in direct contact with and electrically connected to the heater and to the PCM material, wherein the second resistive liner is spaced apart from the first resistive liner.

15. The PCM cell of claim 14, further comprising:
an electrical insulating layer between the first resistive liner and the second resistive liner.

16. A phase change memory (PCM) cell comprising:
a first electrode;
a heater electrically connected to the first electrode;
a PCM material electrically connected to the heater;
a second electrode electrically connected to the PCM material; and
a resistive liner in direct contact with and electrically connected to a sidewall of the heater, wherein the resistive liner has an L-shaped cross-section with a first leg extending along the sidewall of the heater and a second leg extending outward from the heater.

17. The PCM cell of claim 16, further comprising:
a dielectric spacer positioned over a portion of the resistive liner such that the resistive liner is only in direct contact with the PCM material at a first end of the first leg and a second end of the second leg.

18. The PCM cell of claim 16, further comprising:
an electrical insulating layer between and in direct contact with the first electrode and the resistive liner.

19. The PCM cell of claim 16, wherein the resistive liner further comprises:
a third leg extending outward from the heater and spaced apart from the second leg.

20. The PCM cell of claim 19, further comprising:
an electrical insulating layer between the second leg and the third leg.

21. A method of manufacturing a phase change memory (PCM) cell, the method comprising:
forming a first electrode;
forming a first electrical insulating layer on the first electrode;
forming a heater that extends from the first electrode and through the first electrical insulating layer;
forming a resistive liner on the first electrical insulating layer and on a portion of the heater such that a portion of the heater is not covered by the resistive liner;
forming a PCM material on the heater and the resistive liner; and
forming a second electrode on the PCM material.

22. The method of claim 21, wherein forming the resistive liner comprises:
forming the resistive liner over the heater; and
removing a portion of the resistive liner to expose a portion of the heater.

23. The method of claim 21, further comprising:
removing a portion of the resistive liner to expose a portion of the first electrical insulating layer.

24. The method of claim 23, further comprising:
forming a dielectric spacer on the resistive liner around the heater prior to removing the portion of the resistive liner.

25. The method of claim 21, further comprising:
forming a second electrical insulating layer on the first electrical insulating layer prior to forming the heater.

* * * * *